United States Patent [19]

Bray

[11] 3,893,049

[45] July 1, 1975

[54] ELECTRONIC TUNING SYSTEM FOR TELEVISION RECEIVERS

[75] Inventor: Derek Bray, Phoenix, Ariz.

[73] Assignee: Motorola, Inc., Chicago, Ill.

[22] Filed: Mar. 25, 1974

[21] Appl. No.: 454,429

[52] U.S. Cl. .................... 334/15; 325/459; 325/468

[51] Int. Cl. ............................ H03j 1/22; H03h 5/12

[58] Field of Search ......... 334/15, 18; 325/459, 464, 325/468

[56] References Cited

UNITED STATES PATENTS 3,714,585 1/1973 Koch ..................................... 325/464

3,824,475 7/1974 Pflasterer ............................. 325/459

*Primary Examiner*—Alfred E. Smith
*Assistant Examiner*—Wm. H. Punter
*Attorney, Agent, or Firm*—Vincent J. Rauner; Michael D. Bingham

[57] ABSTRACT

An electronic tuning control system for television receivers employs several different functional integrated circuit modules to effect channel selection either locally at the receiver itself or by remote control. The system includes a control circuit which permits sequential scanning or stepping of the different channels in either the "up" or "down" direction. A provision is made for setting tuning control potentiometers for each channel to either a first range of settings indicative of "preferred" channels to which the receiver can be tuned or to a second range indicating that no tuning or channel selection is to be effected for "non-preferred" channels. The second range then is utilized to cause the receiver to automatically skip over such non-preferred channels and scan only those channels having a preferred setting. In addition, direct selection of a channel is effected by closing individual switches associated with each channel. The direct selection circuitry operates through the scanning circuitry in conjunction with the skip mode circuitry to effect substantially instantaneous direct channel selection.

11 Claims, 2 Drawing Figures

ELECTRONIC TUNING SYSTEM FOR TELEVISION RECEIVERS

BACKGROUND OF THE INVENTION

Television receivers commonly employ relatively cumbersome and complex mechanical turret type tuners for tuning the VHF channels, with a different rotary or continuous tuning provision for the UHF channels. For many receivers, two different channel selection knobs are required, and the mechanical tuners occupy a relatively large amount of space immediately behind the front panel of the television receiver. Adjustment of such mechanical tuners is a problem and the addition of remote control capability generally requires a drive motor for rotating the mechanical parts under control of remote signals.

Some mechanical tuners are equipped with programmable switches to permit them to be used to select either a UHF or a VHF channel at a tuner position by programming the tuner for the local area where the television receiver is to be used. The cumbersome mechanical turret tuner with all its disadvantages, however, is made even more complex in such applications.

It is desirable, and in the United States it is being required, that the selection of UHF and VHF channels be accomplished by comparable tuning means. This poses severe problems in the design of turret type mechanical tuners in view of the large number of possible UHF channel positions which must be accommodated for television receivers which are sold in a large number of market places.

The introduction of voltage variable capacitor or varactor VHF and UHF tuners has opened the way for utilization of electronic tuning of television receivers. This permits replacement of the majority of the mechanical parts and contacts present in turret type television tuners. Most electronic tuning systems, however, are custom designed for the particular television receiver in which they are used. If the tuning system is designed for a receiver where channel selection is to be made at the receiver itself and no remote control features are provided, one type of tuning system is used. On the other hand, if remote control capabilities are desired, a different tuning system design is utilized.

A need exists for a practical tuning control system which is readily adaptable to both remote control and local "on-set" control of television tuning by all electronic circuitry. In addition, it is desirable to provide such a tuning system which permits direct selection at the receiver of a particular channel without the need for scanning through other unwanted channels, while still permitting the capability of sequentially stepping or scanning through the channels to which the receiver can be tuned in either the "up" or "down" directions.

RELATED APPLICATION

The copending application to Derek Bray, Ser. No. 454,670, filed 3-25-74, (Case SC-73799), now abandoned, is directed to a modular electronic tuning control system for television receivers employing some portions which are common to portions of the tuning control system of this application.

SUMMARY OF THE INVENTION

Accordingly, it is an object of this invention to provide an improved tuner control system.

It is another object of this invention to provide an improved electronic tuner control system.

It is a further object of this invention to provide a skip mode of operation in an electronic television tuner control system to minimize the time taken to sequence through a large number of channels in order to reach a desired channel.

It is an additional object of this invention to provide a television tuning control system capable of local or remote control of sequencing or stepping through the channels in either the up or the down direction.

It is yet another object of this invention to permit direct selection of a channel at a television receiver utilizing a skip mode of operation to rapidly sequence from the previously tuned channel to the next desired channel at a rate which causes the channel transition to appear to be instantaneous.

In accordance with a preferred embodiment of this invention, an electronic tuning control system for use in television receivers using voltage variable capacitor or varactor tuners, includes a gated clock pulse generator capable of producing clock pulses at a relatively slow rate (low frequency) or at a relatively fast rate (high frequency). The output of the clock pulse generator is coupled to a reversible counter through a pair of gates which are selected to cause the counter to advance in either its forward or reverse direction depending upon which of the gates is enabled.

The output of the counter is used to sequentially couple different tuning control potentiometers with operating potential, and the taps of the potentiometers are set for supplying the tuning voltage for the channel associated with each potentiometer. All of the potentiometer taps are coupled to an analog switch module which provides the desired tuner control voltage on an analog output terminal. The analog switch module also supplies a "skip mode" signal back to the control circuitry for the gated oscillator to cause the oscillator to operate in its fast mode of operation whenever the selected tuning voltage is outside of the normal range used to effect tuning to a television channel. Channels having such a tuning voltage are "non-preferred" channels.

Direct selection of a particular channel also is effected by means of an additional set of switches, which are closed to cause the gated oscillator to operate in its fast mode of operation until the potentiometer for the channel associated with the closed switch is supplied with operating potential. This is sensed by the gated oscillator circuitry and the scan then is stopped on the selected channel. If the selected channel is a non-preferred channel, the gated oscillator is operated in the fast mode of operation by the skip input obtained from the analog steering circuit until the next preferred channel is reached having a tuning voltage setting which corresponds to one which normally occurs for tuning a channel to a television station. Scanning then stops.

DETAILED DESCRIPTION

Figure 1:
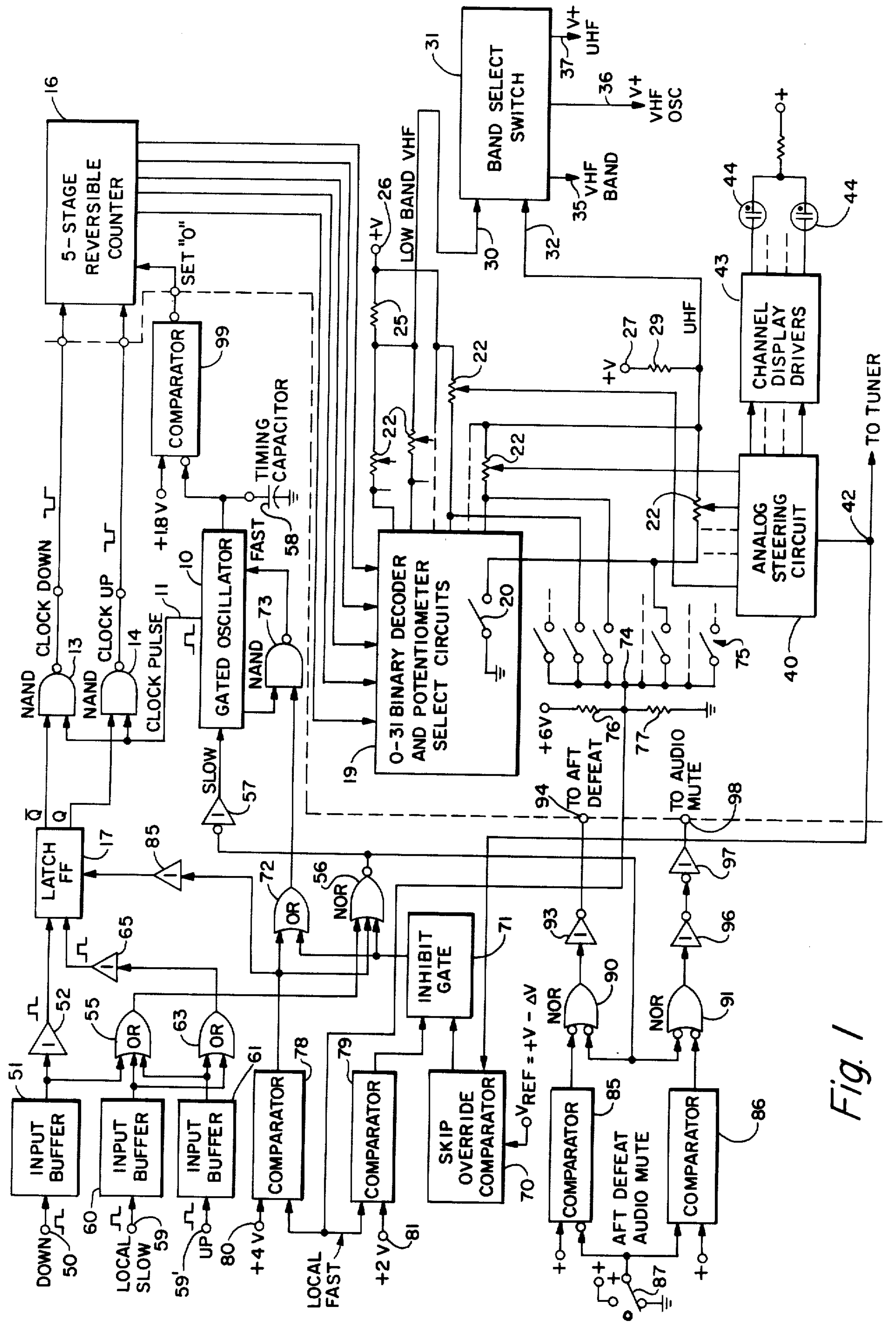
FIG. 1 is a block diagram of a preferred embodiment of the invention.

Referring now to FIG. 1, there is shown, in block diagram form, a modular electronic channel selection system for a television tuner in accordance with a preferred embodiment of this invention. The system shown in FIG. 1 is illustrated as providing 32 different channel selections, but this number is chosen merely for purposes of illustration and is not to be considered limiting. The actual number of channels to which a system in any particular receiver can be tuned can be either greater or less than this number, depending upon the requirements which must be met for the tuning system.

The system illustrated in FIG. 1 is sufficient to cover all of the 12 VHF channel positions used in the U.S. and also provides capacity for an additional 20 UHF channels. This is substantially in excess of the number of UHF channels which normally can be received by a receiver in any particular location in which it is used.

Control of the channel selection is effected by a gated clock pulse generator or gated oscillator circuit 10 which provides clock pulses on its output 11 at either of two frequencies, a slow frequency and a fast frequency. The slow frequency supplied the clock pulses at a low enough rate to permit the operator of the receiver to terminate the scan when it arrives at the channel he desires to view. The fast clock pulse rate, on the other hand, is intentionally selected to scan the channels at a rate far in excess of that which the operator of the receiver can detect. The reason for this is explained subsequently.

The clock pulses applied over the lead 11 from the gated oscillator 10 are applied to the inputs of a pair of NAND gates 13 and 14, the outputs of which are respectively connected to two inputs of a five-stage reversible counter 16. The NAND gate 13, when it is enabled by a latch flip-flop 17, passes the clock pulses to the counter 16 to operate the counter in its reverse or down direction. Thus, the channels are scanned from the higher numbered channels to the lower numbered channels. Similarly, when the NAND gate 14 is enabled by the latch flip-flop 17, the NAND gate 13 is disabled, and the clock pulses passed by the NAND gate 14 are applied to the forward or up input of the reversible counter to cause it to count in the forward direction. This effects sequential scanning of the television channels in the forward direction, that is, from low numbered channels to higher numbered channels.

The five outputs of the five-stage reversible counter 16 are applied to five corresponding inputs of a binary decoder and potentiometer select circuit module 19. Any suitable binary decoder can be used for providing a single output representative of each of the binary encoded signals appearing on the five inputs of the decoder. For this reason, the binary decoder has not been shown in detail.

The single output which is selected by the binary decoder then is used to close a switch 20 to complete a connection to ground to the low potential end of a tuning signal selecting potentiometer 22 individually associated with the particular switch 20 which is selected. It should be understood that there are thirty-two switches 20, each connected to the end of a different one of thirty-two potentiometers 22 for the system. In order to avoid cluttering of the drawing, only a few of the potentiometers 22 and only one switch 20 have been illustrated in FIG. 1. Each of the switches 20 preferably is in the form of an electronic latching switch, included as part of a channel selection module of the type disclosed in applicant's co-pending application mentioned above. In this type of system, only one latching switch 20 is closed at any one time, so that only one of the several potentiometers 22 has a path completed through it from the positive voltage supply to ground. All of the other 31 non-selected potentiometers are connected to open circuits at their low-voltage end.

The potentiometers 22 which represent the low band VHF channels 2, 3, 4, 5, and 6 are connected to the source of V+ at a voltage supply terminal 26 potential through a resistor 25. The potentiometers 22 representative of the high band VHF channels 7 through 13 are connected directly to the source of V+ potential at terminal 26. Finally, the potentiometers 22 which are used to tune the UHF channels are connected to the +V terminal 27 through a resistor 29.

The potentiometers 22 for the different bands to which a television receiver can be tuned, may be arbitrarily grouped in any desired sequence. The successive potentiometers do not need to be assigned to the same band, thereby permitting total flexibility of the tuning sequence to be available to the designer of the television receiver with which this tuning control system is used. Whatever sequence is made, however, all of the UHF potentiometers are connected together at a junction at the lower end of the resistor 29, and all of the low band potentiometers are connected together at a junction at the lefthand end of the resistor 25. The junction of the low band VHF potentiometers with the resistor 25 is connected to a low band sensing input 30 of a band select switch 31. Similarly, the junction of the UHF potentiometers 22 with the resistor 29, is connected to an input 32 of the band select switch 31.

The tuner band select switch 31 preferably is of the type disclosed in the co-pending related application referred to above. This band select switch 31 decodes the input potentials applied to the inputs 30 and 32 to cause the VHF band switch output 35 and VHF oscillator V+ output 36 both to be supplied with positive potential, and the UHF output terminal 37 to be at an open circuit, whenever a high band VHF channel is selected. When a low band VHF channel is selected, the output terminals 35 and 37 are connected to open circuits within the band select switch 31, and a positive potential appears on the VHF oscillator V+ terminal 36. Finally, if a UHF channel is selected, the band select switch module 31 decodes the inputs supplied to it on the input terminals 30 and 32 to cause a positive potential to be applied on the UHF V+ output 37.

The sensing of the voltages at the high potential ends of the potentiometers, which are grouped according to the particular band to which they have been preassigned, makes a very simple circuit connection for controlling the operation of the tuner band select switch module 31. The tuning signal select potentiometers 22 are the same irrespective of the particular band which has been assigned to them. No circuit changes are necessary in any of the components to permit different ones of the potentiometers to be used in different ones of the bands to which the television receiver can be tuned.

The taps of each of the potentiometers 22 are connected to corresponding inputs of an analog steering circuit module 40 which can be in the form of a single integrated circuit module or can be divided into several different modules. The analog steering circuit 40 preferably is of the form of the analog switch/driver integrated circuit modules disclosed in the above related application. The function of this module, as described in that application, is primarily to produce the variable analog direct current tuner output control voltage which is applied from the output of the analog steering circuit 40 to an output terminal 42, which is connected to the tuners of the television receiver in which the system is used. The operation of the analog steering circuit 40 is such that the lowest voltage applied to any one of its 32 inputs is translated as the analog output tuning voltage on the output terminal 42. The reason for this readily can be ascertained when it is noted that only the selected potentiometer has its lower end connected to ground. Therefore, the tap of the selected potentiometer is at a lower voltage than the taps of all of the other potentiometers which are at near the V+ potential since they are all connected to open circuits.

The analog steering circuit 40 also may be provided with 32 digital outputs corresponding to each of the 32 inputs. These outputs may be supplied to channel display drivers 43, which in turn energize selected neon lamps 44, each of which corresponds to the particular potentiometer 22 which is being used to effect the tuning of the television receiver. Other types of displays, such as seven segment numerical displays, can be used; and since displays of this type are well known and do not constitute part of the invention here, no details of the displays are given.

Control of the direction of stepping of the five-stage reversible counter 16 and also control of the rate at which the gated oscillator 10 supplies the clock pulses to the NAND gate 13 and 14 for stepping the counter 16, is effected by applying input signals to various ones of different input terminals to the control system circuitry.

Block diagram logic for the control system is indicated in FIG. 1. In the actual implementation of the control system logic, as shown in detail in FIG. 2, however, many of the logic functions are combined; so that the separate functions are not readily identifiable in the detailed circuit schematic. These functions, however, are illustrated in FIG. 1 for the purpose of showing the manner in which the various controls are effected in response to the input signals.

Assume initially that it is desired to cause the scanning of the channels to be effected in a reverse or down direction, that is from a high numbered channel to a lower numbered channel. To initiate this operation, a positive direct current input control signal or pulse is applied to a down input terminal 50. This signal is applied through an input buffer stage 51 and an inverter 52 to the latch flip-flop 17 to cause the latch flip-flop to apply a positive enabling signal to the input of the NAND gate 13. At the same time, a low signal is applied to the NAND gate 14, thereby disabling the NAND gate 14. Thus, the NAND gate 13 is the only one of the two gates 13 and 14 which is enabled to pass the clock pulses on the lead 11 from the gated oscillator 10. Pulses passed by the output of the NAND gate 13 cause the reversible counter 16 to count sequentially in reverse.

The output of the input buffer 51 also is applied through an OR gate 55 and a NOR gate 56 to an inverter 57 which produces an input to the gated oscillator 10 to cause the gated oscillator to initiate and maintain operation in its slow mode of operation. During the slow mode of operation, the timing capacitor 58 for the oscillator is charged and discharged at a relatively slow rate of operation to produce the clock pulses on the output lead 11 at a low enough frequency to permit the viewer of the television receiver to stop the scan whenever the desired channel is selected as determined by energization of the corresponding neon lamp 44. When the desired channel is reached, the positive potential is removed from the terminal 50, and the gated oscillator 10 no longer receives an enabling input from the output of the inverter 57 and it stops operation. The system then remains in this state indefinitely.

As shown in FIG. 1, the system also includes two other control inputs connected in parallel to effect slow scanning of the channels in the forward or up direction. One of these inputs is identified as "local slow" and is selected by the application of a positive potential to an input terminal 59. This input typically is a push-button or switch actuated input on the television receiver itself. The other input for causing slow scanning in the up direction is labeled up in FIG. 1 and is initiated by the application of a positive potential to an input terminal 59'. The up input for the television receiver preferably is energized in response to a remote control signal.

Inputs applied to the terminals 59 and 59' are passed through input buffer stages 60 and 61, respectively, to the OR gate 55 and to an additional OR gate 63. Inputs to either of the terminals 59 and 59' cause operation of the circuit in the same way, enabling the slow scan mode of the gated oscillator 10 in the same manner described previously with the application of a positive input to the terminal 50. At the same time, the OR gate 63 passes a latching pulse through an inverter 65 to the latching flip-flop 17 to change its state of operation to one in which a high or positive enabling signal is applied to the NAND gate 14 and a low or disabling input is applied to the NAND gate 13. Thus, the NAND gate 14 now passes the clock pulses to the five-stage reversible counter causing it to operate in its forward direction: Whenever the scan is to be terminated, the positive potential applied to either of the input terminals 59 or 59' is removed and the system remains in a standby state indefinitely.

The system also includes a provision for rapidly scanning past channels or channel positions which are non-preferred channels not used in the particular television receiver with which the system is used. To do this, it is necessary to distinguish between preferred and non-preferred channels. This is accomplished by reserving a small portion of the variable tuning voltage at the high potential end of each of the potentiometers 22 as a "skip" voltage range. Any setting within this range means that that channel should be skipped, that is, that it is a non-preferred channel. All other potentiometer settings below this high voltage range then are detected as tuning voltages for a preferred or valid channel to which the receiver can be tuned.

The detection of the preferred and non-preferred channels is effected by monitoring the output voltage on the terminal 42 of the analog steering circuit 40. Assume for example, that the non-preferred tuning voltage extends from the +V voltage on the terminals 26 and 27 to some value ΔV below this voltage. All voltages lower than +V−ΔV then are arbitrarily designated as valid or preferred tuning voltages. Those within the range +V−ΔV, however, are for non-preferred channels.

The tuning voltage provided by the analog steering circuit 40 on the output terminal 42, is monitored and sampled by a skip override comparator circuit 70, which has a reference voltage +V−ΔV applied to it. Every time the tuning voltage on the terminal 42 is greater than this reference voltage, that is indicative of a non-prefered channel, the skip override comparator provides an output which is passed through a normally enabled inhibit gate 71 to inputs of the NOR gate 56 and an OR gate 72. The output of the NOR gate 56 enables operation of the gated oscillator 10 in its slow mode as described previously.

The OR gate 72, however, also passes the output of the inhibit gate 71 to enable a NAND gate 73 to complete the fast mode of operation for the gated oscillator 10. The oscillator 10 provides a second input to the NAND gate 73; and whenever an output is obtained from the OR gate 72 to enable the NAND gate 73, the oscillator is switched to its fast mode of operation to rapidly charge and discharge the timing capacitor 58. This mode of operation continues until the tuning voltage on the terminal 42 from the analog steering circuit is less than +V−ΔV, indicative of a preferred channel. When this occurs, the skip override comparator no longer provides the output to the inhibit gate 71 and no input is applied to the OR gate 72. The oscillator 10 then resumes operation at its slow frequency mode.

The skip override comparator circuit 70 continuously monitors the output signals on the terminal 42 irrespective of which of the other modes of operation in the system is in. The system can be operating in a local-slow, or slow up or down mode of operation; and whenever non-preferred channels are detected, it rapidly skips over those channels at the fast or high frequency of operation until the next preferred channel is reached, whereupon operation in the slow mode once again commences and continues so long as preferred channels are detected as evidenced by the tuning voltage at the output terminal 42 of the analog steering circuit.

The result of this operation, so far as the operator of the receiver is concerned, is one in which the system appears to scan only those channels to which the receiver is tuned in the particular locality in which it is used. For example, if in a given locality only VHF channels 2, 7 and 12 can be received by the receiver, those channels will have the taps of the associated potentiometers 22 set to the proper tuning voltages to receive these respective channels. All of the other potentiometers 22 assigned to the remaining VHF channels, however, will have their taps adjusted to the high potential end of the potentiometers within the voltage range above +V−ΔV.

Then whenever the tuning control system is operated in one of its slow modes of operation in either direction, the skip mode causes the non-selected channels, which lie between the preferred channels, namely, channels 2, 7 and 12 for this example, to be skipped by forcing operation of the oscillator at its high frequency rate between the preferred channels. The operator of the receiver does not detect this skip mode of operation and merely sees the receiver apparently tune only from channel 2 to 7 to 12 in the up direction or vice-versa for the down direction.

A provision also is made for permitting direct selection of a channel at the receiver. Often it is desirable to tune from one channel to another without having to tune through the intermediate channels, as is necessary with the conventional mechanical turret type tuners. To enable direct selection of a channel, irrespective of the particular channel to which the receiver was previously tuned, a plurality of individual switches 75, which may be push-button, finger impedance sensing, or other similar types, are connected between a common terminal 74 and the low potential ends of each of the different potentiometers 22. There is one switch 75 provided for each of the tuning potentiometers 22 in the system.

The common terminal 74 is connected to the midpoint of a voltage divider consisting of a pair of resistors 76 and 77 connected across a relatively low voltage supply (shown as +6 volts). The terminal 74 also is connected to one input of each of a pair of comparator circuits 78 and 79. The comparator circuit 78 is provided with a reference potential on a terminal 80 of +4 volts. Similarly, the comparator circuit 79 is provided with a reference potential on a terminal 81 of +2 volts. The operation of the circuit is such that whenever the voltage on the terminal 74 is between +2 and +4 volts, no outputs are obtained from either of the comparator circuits 78 or 79. When the voltage on the terminal 74 is greater than +4 volts an output is obtained from the comparator circuit 78, but none is obtained from the comparator circuit 79. When the voltage on the terminal 74 is less than +2 volts, an output is obtained from the comparator circuit 79, but none is obtained from the comparator circuit 78.

Assume that one of the switches 75 is closed for a channel to which the receiver is not presently tuned. When this occurs, a high potential substantially at the value of the +V potential on the terminal 26 or 27 for the potentiometer 22 associated with the closed switch is applied to the terminal 74. This occurs since the selection switch 20 in the potentiometer selection circuit 19 is open for that potentiometer at this time. This high potential is greater than the +4 reference voltage applied to the reference terminal 80 of the comparator 78, so that the comparator circuit 78 produces an output which is applied through an inverter 85 to the latch flip-flop 17 to latch the flip-flop 17 to its state of operation indicative of up counting from the reversible counter 16. As stated previously, this causes the NAND gate 14 to be enabled and the NAND gate 13 to be disabled; so that the clock pulses are passed by the NAND gate 14.

At the same time, the output of the comparator 78 is applied to one of the inputs of the NOR gate 56 to initiate operation of the gated oscillator through the inverter 57. In addition, however, the OR gate 72 passes this output to enable the NAND gate 73, so that the oscillator operates in its fast mode of operation.

This continues until the switch 20 for the potentiometer associated with the closed switch 75 also is closed. Ground potential then is applied through the closed switch 75 to the terminal 74. This disables the comparator 78 and its output ceases so that operation of the gated oscillator terminates. The ground potential on the terminal 74 then also causes an output to be obtained from the comparator circuit 79 to disable the inhibit gate 71 until the switch 75 is opened. If a valid preferred tuning voltage is present at the output terminal 42 of the analog steering circuit when the switch 75 is opened to again enable the gate 71, no output is obtained from the skip override comparator 70 so that operation of the gated oscillator 10 continues to be stopped or terminated. The desired channel which was selected by closure of the switch 75 now is tuned to by the tuning control system.

If, however, at the time the selected potentiometer 22 is enabled by the closure of the switch 20 to apply ground potential to the terminal 74, the output voltage of the terminal 42 indicates that the selected potentiometer is for a non-preferred channel, the skip override comparator circuit 70 produces a skip output to the inhibit gate 71 upon opening of the switch 75 to resume operation of the gated oscillator 10 in its high speed mode of operation until the next preferred channel is reached. Then operation of the gated oscillator 10 terminates. The channel to which the receiver then is tuned is not the one which was selected by the closure of a switch 75, but instead is the very next preferred channel which can be selected. This only occurs whenever a switch 75 is closed to select a channel which is not a preferred one, i.e., one to which a valid tuning voltage is set.

Provision also is made for employing AFT defeat and audio mute during channel selection if this feature is desired. To accomplish this, a pair of comparator circuits 85 and 86 are provided each having a positive reference potential applied to it. A second input for each of the comparator circuits 85 and 86 is connected in common to the arm of a three position switch 87 which can be moved from a center, opencircuit position to ground potential or a high positive potential. When the switch 87 is connected to ground, an output is obtained from comparator 86 but not from comparator 85. When the switch 87 is connected to the high positive potential, the comparator circuit 85 produces an output to corresponding NOR gate 90.

The output of the NOR gate 56 also is coupled in common to the second inputs of each of the NOR gates 90 and 91. Whenever an output is obtained from the NOR gate 56, an AFT defeat output is obtained from the NOR gate 90 and applied through an inverter 93 to an AFT defeat output terminal 94. At the same time, an audio mute output is obtained from the output of the NOR gate 91 and applied through a pair of inverters 96 and 97 to an audio mute output terminal 98. This occurs irrespective of the setting of the switch 87. Whenever the output of the NOR gate 56 is terminated to stop operation of the gated oscillator 10, the AFT defeat and audio mute outputs are removed if the switch 87 also is in its open-circuit position.

During operation of the system the timing capacitor 58 never discharges below the +1.8 volt reference applied to a comparator circuit 99 which also has the timing capacitor 58 coupled to its other input. Thus the comparator circuit 99 is normally disabled and does not produce an output signal. When power is removed from the system, as when the television receiver is turned off, the charge on the capacitor 58 leaks off and drops below +1.8 volts. Then when power is subsequently reapplied, as by turning the receiver back on, a pulse is applied by the comparator 99 to set the counter 16 to an initial "0" count. This count can be used to select a potentiometer 22 for a particular, frequently watched channel.

Figure 2:
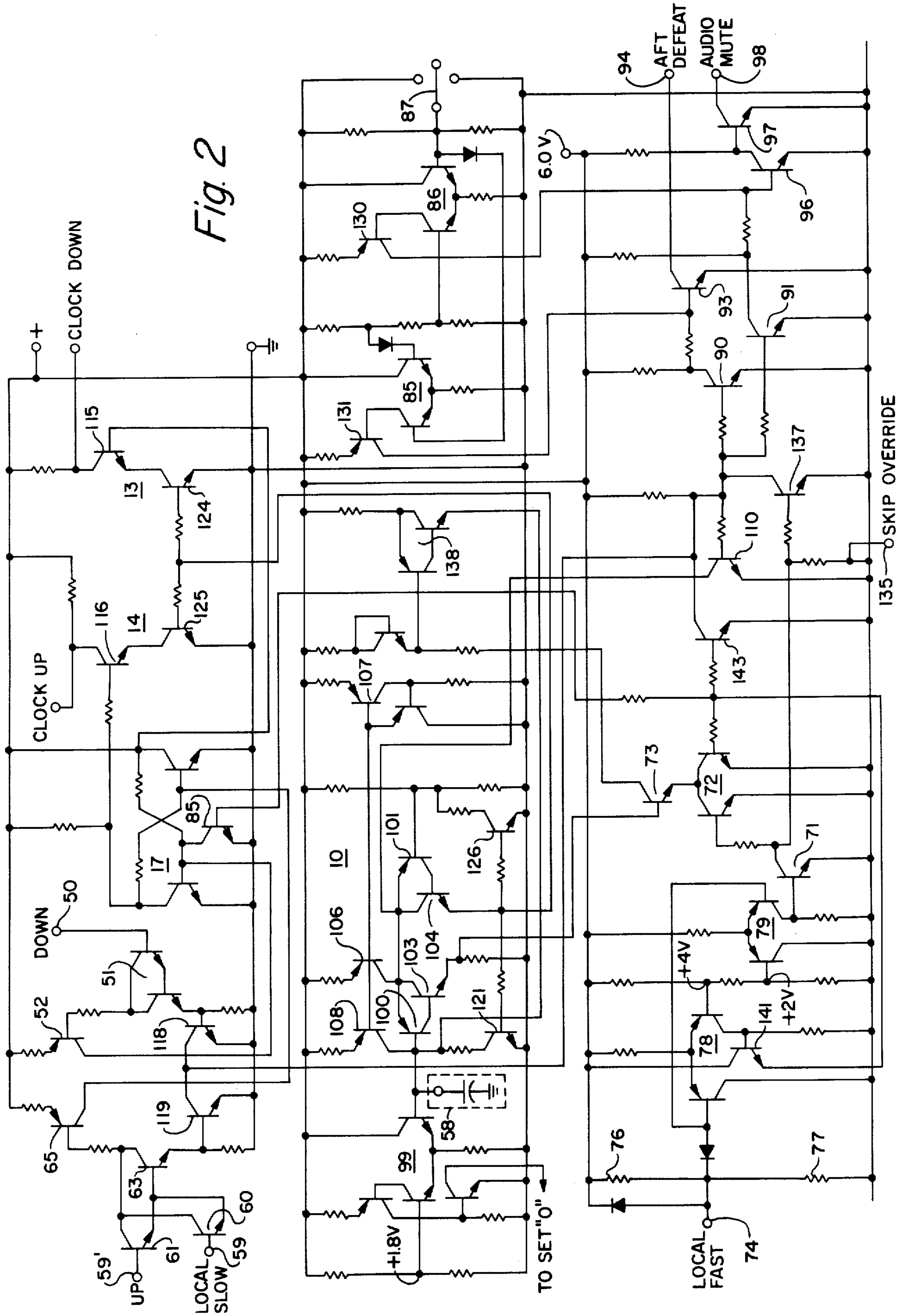
FIG. 2 is a detailed schematic diagram of the control logic system portion of the circuit shown in FIG. 1.

FIG. 2 shows a detailed circuit schematic diagram of the control system portion of the circuit shown in FIG. 1 to the left of the dotted line which divides FIG. 1 approximately in half. The circuit of FIG. 2 includes everything to the left of the dotted line in FIG. 1, except for the skip override comparator circuit 70. For those portions of the circuit of FIG. 2 which are the same as in FIG. 1, the same reference numbers are used. As stated previously, however, some of the logic functions which have been used in the description of FIG. 1 to show the manner in which the various modes of operation are effected, are not all readily identifiable in the detailed schematic in FIG. 2, since some of these functions are combined together into composite circuit configurations. For that reason, some of the reference numbers used to identify various parts of the gates in FIG. 1 are not used in FIG. 2.

The basic circuit element of the control system circuit is the gated clock pulse generator or oscillator 10 used to generate the clock pulses to drive the reversible counter 16. The gated clock pulse oscillator is a relaxation oscillator of a differential amplifier circuit configuration. It includes a pair of PNP input transistors 100 and 101 coupled to a pair of NPN output transistors 103 and 104, respectively. Operating current for the differential amplifier is obtained from a PNP current source transistor 106, the base of which is provided with bias potential from a bias circuit 107 located in the center of the circuit of FIG. 2. Another PNP current source transistor 108 is controlled by the same bias potential as the current source transistor 106 and supplies a low value charging current to the external timing capacitor 58.

When the television receiver is tuned to a station which is being watched, the oscillator is prevented from operating by shunting the current from the current source transistor 106 to ground through a normally conducting NPN shunt transistor 110. In this condition of operation, none of the transistors 100, 101, 103 or 104 is permitted to conduct and the capacitor 58 is allowed to reach full charge by means of the current supplied by the current source transistor 108. This is the standby condition of operation of the circuit.

Now assume that operation of the circuit in either the up, down, or local slow mode of operation is desired. This is initiated by the application of a positive potential on the appropriate one of the input terminals 50, 59 or 59'. Each of these terminals is connected to the base of a corresponding input buffer NPN transistor 51, 60 or 61, respectively. Application of a positive potential on the base of any of these transistors renders it conductive.

Conduction of the Darlington NPN transistor 51 biases a PNP inverter transistor 52 into conduction to apply a positive trigger pulse to one input of the latch flip-flop circuit 17. Similarly, application of a positive potential on either of the input terminals 59 or 59' causes the NPN transistor 63 to be rendered conductive. This in turn biases a PNP transistor 65 into conduction to apply a positive trigger pulse to the other input of the latching flip-flop 17. The stable state to which the latching flip-flop 17 is set depends upon which of its two inputs receives the trigger pulse. The two outputs of the latching flip-flop 17 are applied, respectively, to the bases of a pair of NPN transistors 115 and 116 each forming part of the NAND gates 13 and 14, respectively. If the transistor 115 is rendered conductive, the transistor 116 is rendered non-conductive and vice-versa. For operation of the counter 16 in the down mode, the transistor 115 is rendered conductive. For operation of the counter 16 in the up mode, the transistor 116 is rendered conductive.

Application of a positive input on any of the terminals 50, 59 and 59' also renders conductive one or the other of a pair of NPN transistors 118 and 119 which function as the OR gate 55 of FIG. 1. The collectors of these transistors are interconnected to the base of the transistor 110; so that when either of the transistors 118 or 119 becomes conductive, a near ground potential is applied to the base of the transistor 110, causing it to be rendered non-conductive. This immediately permits the transistors 101 and 104 of the differential gated clock pulse oscillator to conduct since the capacitor 58 applies a positive potential on the base of the PNP transistor 100 which is higher than the reference potential applied to the base of the transistor 101 from a voltage divider in the voltage reference circuit 107.

The affect of this is to immediately cause an NPN amplifier transistor 121 to be rendered conductive to discharge the capacitor 58 to slightly above +1.8 volts.

At the same time, the positive potential which appears on the emitter of the transistor 104, when it is rendered conductive, results in a positive pulse applied to the bases of two NPN transistors 124 and 125 which are included in the NAND gates 13 and 14, respectively, to render those transistors conductive. Whenever this occurs, a negative-going clock output pulse is obtained on the collector of whichever one of the transistors 115 and 116 has previously been rendered conductive by the state of the latching flip-flop 17.

The positive output pulse appearing on the emitter of the transistor 104 also is coupled to the base of an NPN shunt transistor 126 to render that transistor conductive. This lowers the bias potential on the base of the transistor 101 to permit the capacitor 58 to reach its maximum discharge (just above +1.8 volts). Then the conductivity states of the transistors 100, 101, 103 and 104 reverse; the transistors 101 and 104 become non-conductive and the transistors 100 and 103 conduct. In this state of operation, the transistors 121, 124, 125 and 126 are rendered non-conductive, charging of the capacitor 58 once again commences through the current source transistor 108, and the cycle repeats. This operation continues so long as a positive input potential continues to be applied to any one of the terminals 50, 59 and 59'.

If it is desired to produce an AFT defeat output on the terminal 94 the AFT defeat audio mute switch 87 is moved to the upper position in FIG. 2 to connect it to the source of positive potential. This in turn causes the NPN differential amplifier comparator circuit 85 to drive a PNP output transistor 131 conductive to couple positive potential to the base of an NPN inverter transistor 93 to render it conductive.

Whenever the transistor 93 conducts ground potential is coupled to the AFT defeat terminal 94.

If it is desired to produce an audio mute output on the terminal 98, the AFT/audio mute switch 87 is moved to the lower position in FIG. 2. This causes the NPN differential amplifier circuit 86 to drive a PNP output transistor conductive to couple positive potential to the base of an NPN inverter transistor 96 to render it conductive. Whenever the transistor 96 conducts, it causes an NPN transistor 97 to be rendered non-conductive, coupling an open circuit to the audio mute output terminal 98.

Conductivity of the NOR gate transistors 90 and 91 is controlled by the potential on the collectors of the transistors 118 and 119 in the same manner that the current source shunt transistor 110 is controlled. Thus, whenever a positive input potential or voltage is present on any of the terminals 50, 59 and 59', the transistors 90 and 91 are biased off, which produces the AFT defeat and audio mute outputs on the terminals 94 and 98 by driving the transistors 93 and 96 conductive irrespective of the setting of the switch 87.

Assume now that the circuit is operating with one of the three inputs supplied to the terminals 50, 59 and 59' present. Now, however, the operation is to be considered in conjunction with the operation of the skip override comparator circuit 70 which supplies output signals to the inhibit gate 71 of FIG. 1, whenever a "non-preferred" channel is selected or scanned by the system. Any time a non-preferred channel is selected by the circuit 19, a positive potential is applied to the skip override input terminal 135 of FIG. 2. This terminal is the output of the skip override comparator circuit 70 shown in FIG. 1. When a preferred channel is selected by the system, the signal on the skip override terminal 135 is at ground potential.

The operation of the circuit which has been described thus far is for when all of the channels which are selected in sequence are preferred channels with ground potential on the terminal 135. When a non-preferred channel is detected, the positive potential on the skip override terminal 135 renders an NPN transistor 137 conductive to maintain ground potential on the bases of the transistors 90, 91 and 110, thereby maintaining these transistors in their cut off state to permit continued operation of the gated clock pulse oscillator even if the input potential on the terminals 50, 59 and 59' is removed at the time the system has selected a nonpreferred channel. At the same time, this positive signal appears on the collector of a normally non-conductive transistor 71 to bias into conduction the lefthand NPN transistor of the OR gate 72 to couple ground potential to the emitter of an NPN NAND gate transistor 73. The base of the transistor 73 is connected to the emitter of the transistor 103 of the differential oscillator circuit, so that the transistor 73 then conducts during the charge interval of the capacitor 58 and is non-conductive during the discharge interval.

So long as a skip override positive potential is applied to the terminal 135 and the oscillator 10 is in its charging state of operation for the capacitor 58, ground potential appears on the collector of the transistor 73 to render a composite PNP/NPN transistor 138 conductive to apply relatively high current through a low impedance path to the capacitor 58 to rapidly charge the capacitor 58. This places the oscillator in its fast mode of operation, and this mode of operation continues until the input on the skip override terminal 135 once again drops to ground potential. That condition occurs when a valid tuning voltage for a preferred channel is sensed by the comparator 70 on the output terminal 42.

Whenever an enabling input is applied to any of the terminals 50, 59 and 59' to cause the circuit to scan sequentially the channels in either the up or down direction, the scanning is at a slow rate so long as valid or preferred channels are sampled. As soon as a non-preferred channel is sampled, the scanning is rapid until the next preferred channel, whereupon the slow rate of scan once again resumes. As described previously, the scanning rate in the fast mode of operation is selected to be such that the operator is unaware that a step scan is being made of the non-preferred channels.

Assume now that there is no positive input applied to any of the terminals 50, 59 and 59'. Instead, however, consider the condition when one of the switches 75 (FIG. 1) is closed to place the system in its local fast mode of operation as described previously. When a switch 75 is closed to select a new channel, initially a relatively positive potential is applied to the local fast input terminal 74. This biases off the lefthand PNP transistor of a differential PNP comparator circuit 78 and biases on the normally off righthand transistor of that comparator. An NPN output transistor 141 for the comparator then is rendered conductive to apply a positive potential to the righthand transistor of the OR gate 72, causing conduction of that transistor. Positive potential also is applied to the base of an NPN transistor 143 to render that transistor conductive. When the transistor 143 conducts, it applies near ground potential to the bases of the transistors 110, 90 and 91, turning off those transistors to permit the oscillator to operate. Thus, the transistor 143 acts as one portion of the NOR gate 56 which is shown in FIG. 1.

Since the righthand transistor of the OR gate 72 is conductive, the transistor 73 conducts during the charge intervals for the capacitor 58; and the oscillator operates in its fast mode of operation. This continues until the selection circuit 19 grounds the end of the potentiometer 22 connected to the closed switch 75. The potential on the terminal 74 then drops to near ground potential. This causes the lefthand PNP transistor of the comparator 78 and the righthand transistor of the comparator 79 to become conductive. Thus, the transistor 141 becomes non-conductive and the inhibit gate transistor 71 conducts.

When the transistor 141 becomes non-conductive, the righthand transistor of the OR gate 72 also is rendered non-conductive so that control of the OR gate 72 is removed from the local fast input terminal 74. At the same time the transistor 143 is rendered non-conductive so that operation of the shunt transistor 110 and of the NOR gate transistors 90 and 91 is returned to the transistor 137 under control of the skip override input on the terminal 135 and the conductive inhibit gate transistor 71. So long as the switch 75 remains closed, the transistor 71 conducts and biases on the transistors 110, 90 and 91 and the operation stops irrespective of the input on the skip override input terminal 135. This is done to prevent any error-causing interference between the skip-mode of operation and the local fast operation of the system.

Now assume the switch 75 is opened. The conductivity state of the comparator 79 reverses, but that of the comparator 78 remains the same. The transistor 71 once again becomes non-conductive. If the channel which has been selected in this fast mode of operation is a preferred channel, the input on the skip override terminal 135 at this time also is at ground potential. Thus, the transistors 110, 90 and 91 all remain conductive, and the operation of the oscillator does not resume. The system is tuned to the channel which was selected by closure of the switch 75. The circuit remains in this state until channel selection to a new channel by one of the several modes mentioned above is initiated.

If the channel which had been selected was a non-preferred channel when the switch 75 is opened, the operation is different. Under this condition of operation, the tuning potential appearing on the terminal 42 (FIG. 1) and applied to the skip override comparator circuit 70, is greater than the reference potential applied to the skip override comparator resulting in a positive potential applied to the skip override terminal 135. This causes the oscillator to continue operation in its fast mode until the next valid preferred channel is reached, whereupon the potential on the skip override terminal 135 drops to ground potential to turn off the oscillator.

The system which has been described is highly flexible in its mode of operation. Scanning of different channels to which the oscillator is tuned can be effected at a slow rate in either the up or down direction locally or by remote control. The skip mode of operation permits this scanning to appear as if it is only of those channels to which the television receiver in any given locality can be tuned.

The portions of the tuning system which are assigned to channels which cannot be tuned in any given locality can be skipped merely by setting the tuning potentiometers for those channels to the high end of their range. This automatically causes the system to operate in a fast mode of operation to effectively skip over these non-prefered chananels, so that the annoyance of even momentary tuning to a channel on which no signal appears is avoided. In addition, direct select switch 75 permits substantially instantaneous direct selection of a desired channel by operating the receiver locally in its fast mode of operation until the channel selected by closure of the switch is reached. If the switch is closed inadvertently to a non-preferred channel, the system automatically steps to the nearest preferred channel in the sequence in which the circuit is operating.

For some applications of the system, it may be desirable to provide an output whenever the oscillator 10 is operating in its fast mode. Such an output is present at the output of the OR gate 72 and can be used to blank the display driver 43 to prevent annoying flicker of the display lamps 44 during the fast mode of operation.

What is claimed is:

1. An electronic tuner control system including in combination:

a gated clock pulse generator for producing clock pulses at first and second frequencies on an output thereof, said second frequency being higher than said first frequency;

control means energizable for initiating and maintaining operation of said gated clock pulse generator to cause said clock pulse generator to produce said clock pulses in response thereto at said first frequency and to terminate production of said clock pulses upon deenergization of said control means;

overriding means coupled with said gated clock pulse generator for overriding said control means and maintaining operation of said gated clock pulse generator for so long as an input signal to said overriding means is within a second predetermined range of signals and for terminating operation of said gated clock pulse generator following deenergization of said control means when the input signal to said overriding means is in a first predetermined range of signals; and direct select switch means coupled with said gated clock pulse generator for causing operation thereof at said second frequency.

2. The combination according to claim 1 further including means coupled with said control means and said override means for supplying a first output control signal when said gated clock pulse generator is operating to produce clock pulses on the output thereof; and further means coupled with said direct select switch means and the output of said override means for supplying a second output signal when said gated clock pulse generator is operating to produce clock pulses on the output thereof at said second frequency.

3. The combination according to claim 1 further including a plurality of tuning signal selecting means, at least some of which are settable for producing first tuning signals in said first predetermined range indicative of a preferred setting of tuning signals and capable of producing second signals in said second predetermined range indicative of non-preferred tuning signals;

an analog tuning output terminal;

means coupled with the output of said gated clock pulse generator and responsive to said clock pulses for sequentially causing different ones of said plurality of tuning signal selecting means to be coupled with said analog tuning output terminal to control the tuning signal in said first and second predetermined ranges thereon; and wherein the input of said overriding means coupled with said analog tuning output terminal and is responsive to signals appearing on such output terminal.

4. The combination according to claim 3 wherein said plurality of tuning signal selecting means comprise a plurality of potentiometers and wherein said means for sequentially causing different ones of said plurality of tuning signal selecting means causes said potentiometers to be sequentially connected across a source of direct current potential, each of said potentiometers having an adjustable tap, and further including means for coupling the adjustable taps of said potentiometers with said analog tuning output terminal.

5. The combination according to claim 3 wherein said means for sequentially causing different ones of said plurality of tuning signal selecting means to be coupled with said analog tuning output terminal includes a reversible counter, and further including means coupled with said control means for establishing the direction of counting of said reversible counter.

6. An electronic tuner control system including in combination:

a gated clock pulse generator for producing clock pulses at first and second frequencies on an output thereof, said second frequency being higher than said first frequency;

a plurality of tuning voltage selection circuit means, each settable to provide tuning voltages in either a first predetermined range or a second predetermined range;

analog steering circuit means having a plurality of inputs each coupled with a different one of said plurality of tuning voltage selection circuit means for producing on an analog output terminal an analog tuner control voltage corresponding to the setting of a selected tuning voltage selection circuit means;

means coupled with the output of said gated clock pulse generator and coupled with said tuning voltage selection circuit means for sequentially energizing said tuning voltage selection circuit means one at a time under control of said clock pulses;

control means for initiating and maintaining said gated clock pulse generator into operation at said first frequency in response to a predetermined input condition and for terminating operation of said gated clock pulse generation upon cessation of said predetermined input condition;

override means coupled with said analog steering circuit and responsive to said analog tuning voltage and further coupled with said gated clock pulse generator for maintaining operation thereof at said second frequency after cessation of said predetermined input condition in response to analog tuning control voltages in said second predetermined range of voltages and for terminating operation of said gated clock pulse generator circuit in response to analog tuning control voltages in said first predetermined range of voltages; and direct select switch means coupled with said gated clock pulse generator and said override means for disabling said override means and for causing said clock pulse generator to produce pulses at said second frequency.

7. The combination according to claim 6 wherein said means for sequentially energizing said tuning voltage selection circuit means includes reversible counting means and said control means comprises at least first and second control means coupled with said reversible counter, said first control means operating to cause said reversible counting means to sequentially energize said tuning voltage selection circuit means in one direction and said second contol means operating to cause said counting means to energize said tuning voltage selection circuit means in the opposite direction.

8. The combination according to claim 6 wherein said plurality of tuning voltage selection circuit means comprises a plurality of potentiometers, each having an adjustable tap coupled with a different one of the plurality of inputs of said analog steering circuit means, and said means for sequentially energizing said tuning voltage selection circuit means comprises means for connecting said potentiometers across a source of direct current potential one at a time under control of said clock pulses.

9. An electronic tuning control system including in combination:

a gated clock pulse generator capable of producing output pulses on an output terminal thereof at first and second frequencies, said second frequency being higher than said first frequency;

control circuit means for initiating and maintaining operation of said gated clock pulse generator at said first frequency of operation in response to a control signal input, operation of said oscillator under control of said control means terminating upon removal of said control signal input;

means for applying a control signal input to said control circuit means;

a plurality of tuning voltage generating means, each settable to provide tuning voltages in first and second predetermined ranges of voltages;

analog steering circuit means coupled with each of said tuning voltage generating means to provide an analog tuning voltage on its output having a predetermined relationship to the tuning voltage applied thereto from said tuning voltage generating means;

means coupled with the output of said gated clock pulse generator and further coupled with said tuning voltage generating means for sequentially enabling said tuning voltage generating means to supply tuning voltages to said analog steering circuit means in response to clock pulses from the output of said gated clock pulse generator;

override means coupled with said analog steering circuit means for providing a first output signal on an output thereof in response to tuning voltages supplied to said analog steering circuit means in said first predetermined range and for providing a second output signal on the output thereof in response to tuning voltages supplied to said analog steering circuit in said second predetermined range;

means coupling the output of said override means with said gated clock pulse generator for causing said gated clock pulse generator to produce clock pulses at said second frequency of operation in response to said second output voltage from said control circuit means;

comparator means; and a plurality of normally open direct select switch means each coupled between different ones of said plurality of tuning voltage generating means and input of said comparator means, the output of said comparator means coupled with said override means for supplying input signals thereto in said second predetermined range whenever one of said direct select switch means is closed to interconnect the input of said comparator means with a nonenabled tuning voltage generating means and for supplying input signals to said overriding means in said first predetermined range whenever one of said direct select switch means is closed to interconnect the input of said comparator means with an enabled tuning voltage generating means.

10. The combination according to claim 9 wherein said plurality of tuning voltage generating means comprises a plurality of potentiometers each having an adjustable tap coupled with said analog steering circuit means and wherein said means for sequentially enabling said tuning voltage generating means comprises means for connecting said potentiometers sequentially across a direct current supply voltage.

11. The combination according to claim 9 further including means coupled with said control means and said override means for supplying a first output control signal when said gated clock pulse generator is operating to produce clock pulses on the output thereof; and further means coupled with said direct select switch means and the output of said override means for supplying a second output signal when said gated clock pulse generator is operating to produce clock pulses on the output thereof at said second frequency.

* * * * *